(12) United States Patent
Buchanan

(10) Patent No.: US 7,894,561 B1
(45) Date of Patent: Feb. 22, 2011

(54) METHOD AND SYSTEM FOR PROVIDING DYNAMIC DC OFFSET CORRECTION

(75) Inventor: Benjamin C. Buchanan, Suwanee, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 846 days.

(21) Appl. No.: 11/820,914

(22) Filed: Jun. 21, 2007

(51) Int. Cl.
*H04L 7/00* (2006.01)

(52) U.S. Cl. .................. 375/355; 375/354; 375/346; 327/307; 327/362; 370/503; 341/118; 455/234.2; 455/296

(58) Field of Classification Search .................. 375/355, 375/354, 346; 327/307, 362; 370/503; 341/118; 455/234.2, 296
See application file for complete search history.

(56) References Cited

U.S. PATENT DOCUMENTS

| | | | |
|---|---|---|---|
| 3,988,689 | A | 10/1976 | Ochi et al. |
| 4,138,649 | A | 2/1979 | Schaffer |
| 4,355,285 | A | 10/1982 | Kelley et al. |
| 4,939,516 | A | 7/1990 | Early |
| 5,041,794 | A | 8/1991 | McMorrow, Jr. et al. |
| RE34,428 | E | 11/1993 | George et al. |
| 5,334,944 | A | 8/1994 | Hirakata |
| 5,410,270 | A | 4/1995 | Rybicki et al. |
| 5,623,220 | A | 4/1997 | Betti et al. |
| 5,844,427 | A | 12/1998 | Theus et al. |
| 5,949,819 | A | 9/1999 | Bjarnason et al. |
| 6,317,064 | B1 * | 11/2001 | Ferrer et al. ................. 341/118 |
| 6,442,213 | B1 * | 8/2002 | Krone et al. ................. 375/285 |
| 6,664,840 | B2 * | 12/2003 | Cahalane et al. ............ 327/307 |
| 6,806,756 | B1 * | 10/2004 | Manlove et al. ............. 327/307 |
| 6,842,486 | B2 | 1/2005 | Plisch et al. |
| 6,975,674 | B1 * | 12/2005 | Phanse et al. ............... 375/219 |
| 7,095,667 | B2 | 8/2006 | Baker |
| 7,161,428 | B2 | 1/2007 | Mendenhall |
| 7,239,199 | B1 * | 7/2007 | Chien et al. ..................... 330/9 |
| 7,340,662 | B1 * | 3/2008 | McElwee et al. ............ 714/742 |
| 7,525,365 | B1 | 4/2009 | Henry |
| 2008/0159415 | A1 * | 7/2008 | Miller et al. ................. 375/258 |

OTHER PUBLICATIONS

Lisheng Xu, et al., "Baseline wander correction in pulse waveforms using wavelet-based cascaded adaptive filter", Computers in Biology and Medicine 37 (2007), pp. 716-731.

Xu Lisheng, et al., "Adaptive Baseline Wander Removal in the Pulse Waveform", Proceedings of the 15th IEEE Symposium on Computer-Based Medical Systems, 2002, pp. 1-6.

* cited by examiner

*Primary Examiner*—Shuwang Liu
*Assistant Examiner*—Kenneth Lam

(57) ABSTRACT

A method for providing dynamic DC offset correction is provided. The method includes receiving a plurality of uncorrected samples. A determination is made regarding whether a specified number of consecutive uncorrected samples that correspond to a nominal voltage level has been received. When the specified number of consecutive uncorrected samples that correspond to the nominal voltage level has been received, an offset is generated based on an actual voltage level for each of the consecutive uncorrected samples.

20 Claims, 4 Drawing Sheets

METHOD AND SYSTEM FOR PROVIDING DYNAMIC DC OFFSET CORRECTION

TECHNICAL FIELD

This disclosure is generally directed to signal processing and, more specifically, to a method and system for providing dynamic DC offset correction.

BACKGROUND

Receivers often have a DC offset with respect to a receiver input signal such that the actual voltage of the signal becomes offset from its ideal voltage. The DC offset may be introduced into the signal prior to its being input to the receiver, within the receiver itself, or in a combination of these. This effect can reduce the performance of the receiver.

In systems such as 100 Mb/s and Gigabit Ethernet and the like, conventional receivers typically address DC offset correction using a combination of analog and digital circuitry. The electrical signaling in these systems is such that there is a continuous non-static waveform at the receiver input. Thus, there is no time period during which the receiver input signal remains at a nominal voltage level. In addition, the signal voltage levels are usually such that the output of an analog-to-digital converter (ADC) in the receiver does not use the entire range of the ADC. Thus, conventional DC offset correction is unsuitable for systems such as 10 Mb/s Ethernet receivers because it is not possible to determine an accurate offset based on maximal- and minimal-valued ADC outputs.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior as well as future uses of such defined words and phrases.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged receiver.

Figure 1:
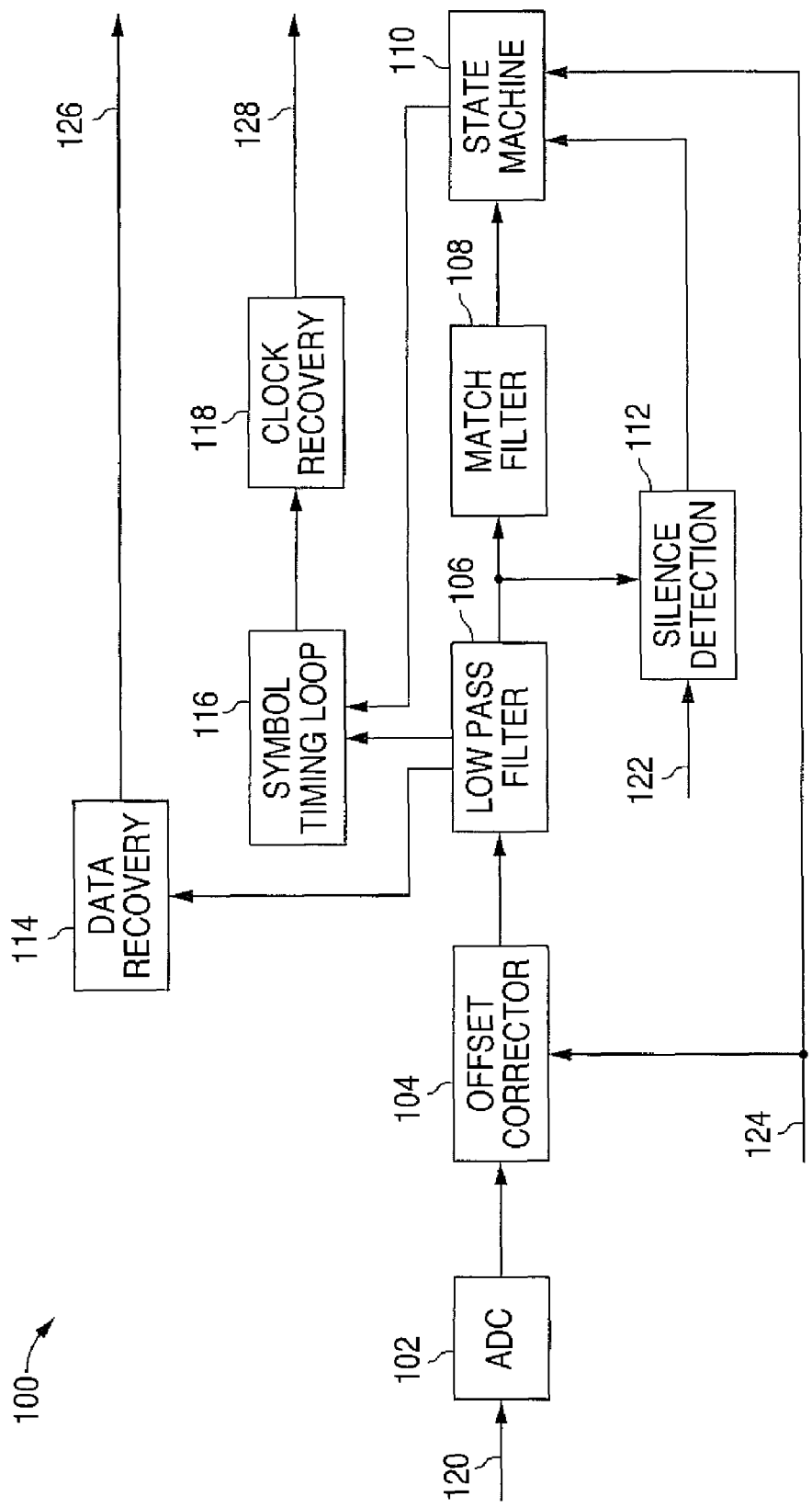
FIG. 1 illustrates an Ethernet receiver capable of providing dynamic DC offset correction according to one embodiment of this disclosure.

FIG. 1 illustrates a 10 Mb/s Ethernet receiver 100 capable of providing dynamic DC offset correction according to one embodiment of this disclosure. For this embodiment, the receiver 100 comprises an analog-to-digital converter (ADC) 102, an offset corrector 104, a low pass filter 106, a match filter 108, a state machine 110, a silence detection block 112, a data recovery block 114, a symbol timing loop 116 and a clock recovery block 118.

The ADC 102 is operable to sample an analog serial differential input signal 120 and to convert the analog signal 120 into a single-ended digital signal. The actual voltage level of the digital signal generated by the ADC 102 may have a DC offset with respect to an accurate voltage level that should be generated by the ADC 102. Thus, as described in more detail below in connection with FIGS. 2-4, the offset corrector 104, which is coupled to the ADC 102, is operable to generate a DC offset and to apply the offset to the digital signal generated by the ADC 102 in order to adjust the voltage level of the digital signal closer to the accurate voltage level.

The 10 Mb/s Ethernet protocol utilizes data packets that are encoded with either a differential +1 or −1. Following the reception of each packet, the protocol calls for a minimum of 9.6 microseconds of silence. During this silent period, the input signal 120 remains at a nominal differential zero voltage level. The offset corrector 104, which may be implemented using only digital logic, is operable to generate the offset based on the nominal zero voltage level that is provided by the ADC 102 when the receiver 100 is idle during the silent period.

The low pass filter 106 is coupled to the offset corrector 104 and is operable to reject frequencies higher than those known to include data. For example, for the case of the 10 Mb/s Ethernet receiver 100 that only expects frequencies of 5 MHz or 10 MHz, the low pass filter 106 is operable to reject frequencies above the expected frequencies based on the assumption that higher frequencies result from noise or interference.

The match filter 108 is coupled to the low pass filter 106 and the state machine 110 and is operable to compare several consecutive filtered ADC samples to a desired analog pulse shape from a remote transmitter in order to determine whether or not there is a match. The match filter 108 is also operable to notify the state machine 110 when such a match is found. The silence detection block 112, which is coupled to the low pass filter 106 and the state machine 110, comprises a counter that is operable to detect a number of consecutive samples whose magnitude is below a predefined turn-off threshold 122. The silence detection block 112 is also operable to notify the state machine 110 when a specific number of these consecutive samples are detected. The state machine 110 is operable to control the flow and timing of data based on signals received from the match filter 108 and the silence detection block 112. In addition, the offset corrector 104 and the state machine 110 are also operable to perform their respective functions based on a turn-on threshold 124.

The data recovery block 114 is coupled to the low pass filter 106 and is operable to receive serial filtered ADC samples from the low pass filter 106 and to convert them into parallel data 126. The data recovery block 114 is also operable to provide this parallel digital data 126 to the media access control (MAC) data communication protocol sub-layer.

Because the 10 Mb/s Ethernet receiver 100 is a simple signaling environment, the symbol timing loop 116, which is coupled to the low pass filter 106 and the state machine 110, is operable to determine when the signed ADC samples cross zero in a positive or negative direction within a certain time period in order to assist the clock recovery block 118. The clock recovery block 118 is coupled to the symbol timing loop 116 and is operable to generate a digital data clock 128 to which the data 126 recovered by the data recovery block 114 may be synchronized based on information from the symbol timing loop 116. The clock recovery block 118 is also operable to provide this digital clock 128 to the MAC sub-layer for sampling the parallel data 126.

Figure 2:
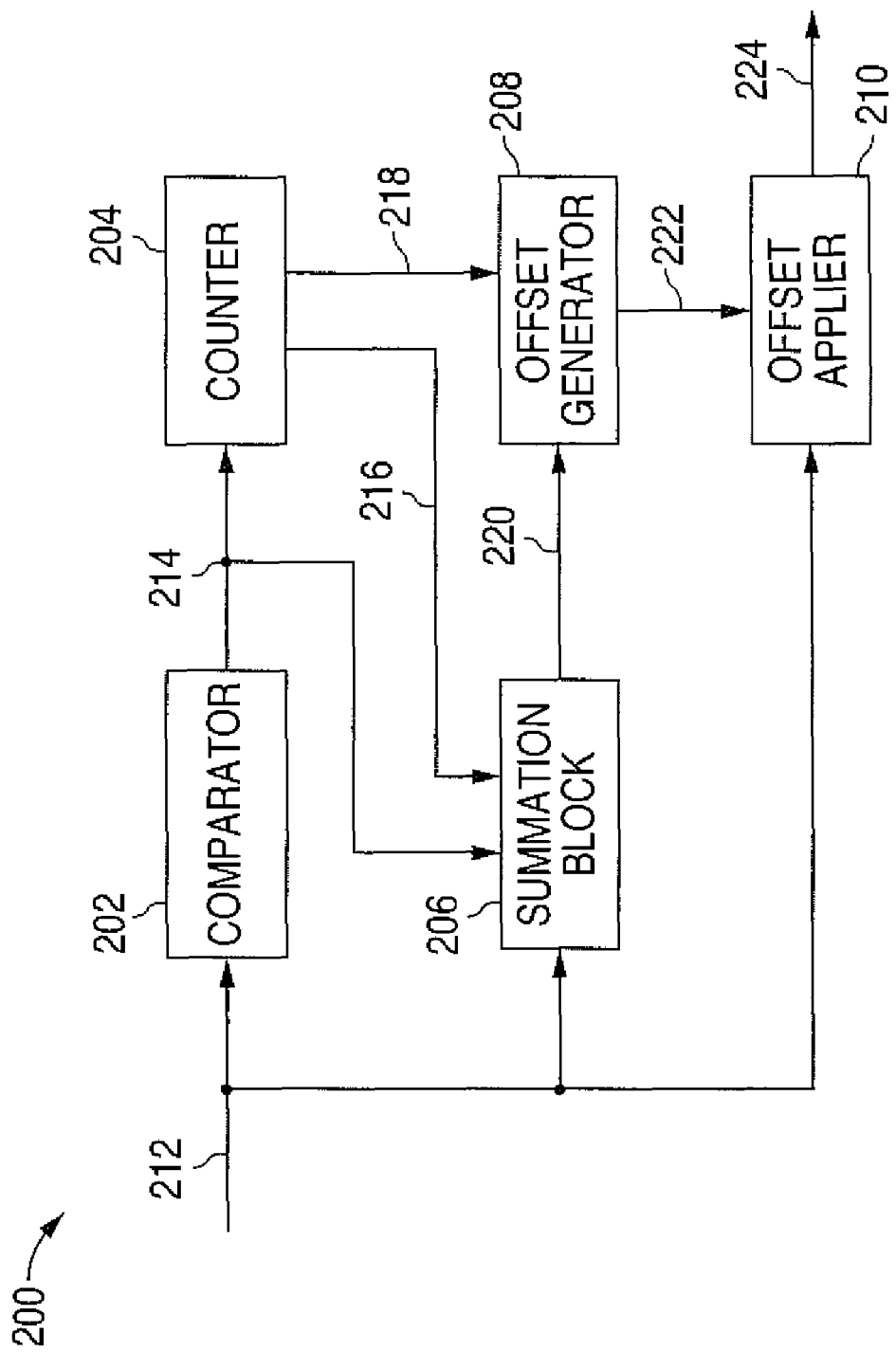
FIG. 2 illustrates an offset corrector, such as the offset corrector of FIG. 1, according to one embodiment of this disclosure.

FIG. 2 illustrates an offset corrector 200 according to one embodiment of this disclosure. The offset corrector 200 may be implemented as the offset corrector 104 of the Ethernet receiver 100 described in FIG. 1. However, it will be understood that the offset corrector 200 may be implemented in any other suitable receiver or device having a recurring hold period during operation. As used herein, a "hold period" means a specified period of time during which an input signal for the device remains at a nominal voltage level.

The offset corrector 200 comprises a comparator 202, a counter 204, a summation block 206, an offset generator 208 and an offset applier 210. The comparator 202 is operable to receive an uncorrected sample 212 from an analog-to-digital converter and to compare the uncorrected sample 212 to an acquisition threshold in order to determine whether the uncorrected sample 212 comprises an actual voltage level that corresponds to a predefined nominal voltage level. The comparator 202 is operable to assert a met_threshold signal 214 when the uncorrected sample 212 does not comprise an actual voltage level that corresponds to the nominal voltage level. Similarly, the comparator 202 is operable to de-assert the met_threshold signal 214 when the uncorrected sample 212 does comprise an actual voltage level that corresponds to the nominal voltage level.

The counter 204, which is coupled to the comparator 202, is operable to be reset when the met_threshold signal 214 is asserted and to begin counting when the met_threshold signal 214 is de-asserted. In addition, the counter 204 is operable to assert a start_sum signal 216 when the value of the counter 204 is zero and to de-assert the start_sum signal 216 when the value of the counter 204 is non-zero. Similarly, the counter 204 is operable to assert a calculate signal 218 when the counter 204 reaches a maximum value and to de-assert the calculate signal 218 when the counter 204 comprises a non-maximum value.

The summation block 206, which is coupled to the comparator 202 and the counter 204, is operable to be reset when the met_threshold signal 214 is asserted and to begin summing uncorrected samples 212 when the start_sum signal 216 is asserted. The summation block 206 is also operable to generate as an output a summation 220 of the uncorrected samples 212.

The offset generator 208, which is coupled to the counter 204 and the summation block 206, is operable to receive the summation 220 from the summation block 206 and, when the calculate signal 218 is asserted, to generate a new offset 222 based on the summation 220. When the calculate signal 218 is de-asserted, the offset generator 208 is operable to continue outputting a previously generated offset 222. The offset applier 210 is coupled to the offset generator 208 and is operable to apply the offset 222 to uncorrected samples 212 to generate corrected samples 224. Thus, as each hold period is detected based on the counter 204 reaching its maximum value and asserting the calculate signal 218, an updated offset 222 is generated and applied to subsequently received uncorrected samples 212.

Figure 3:
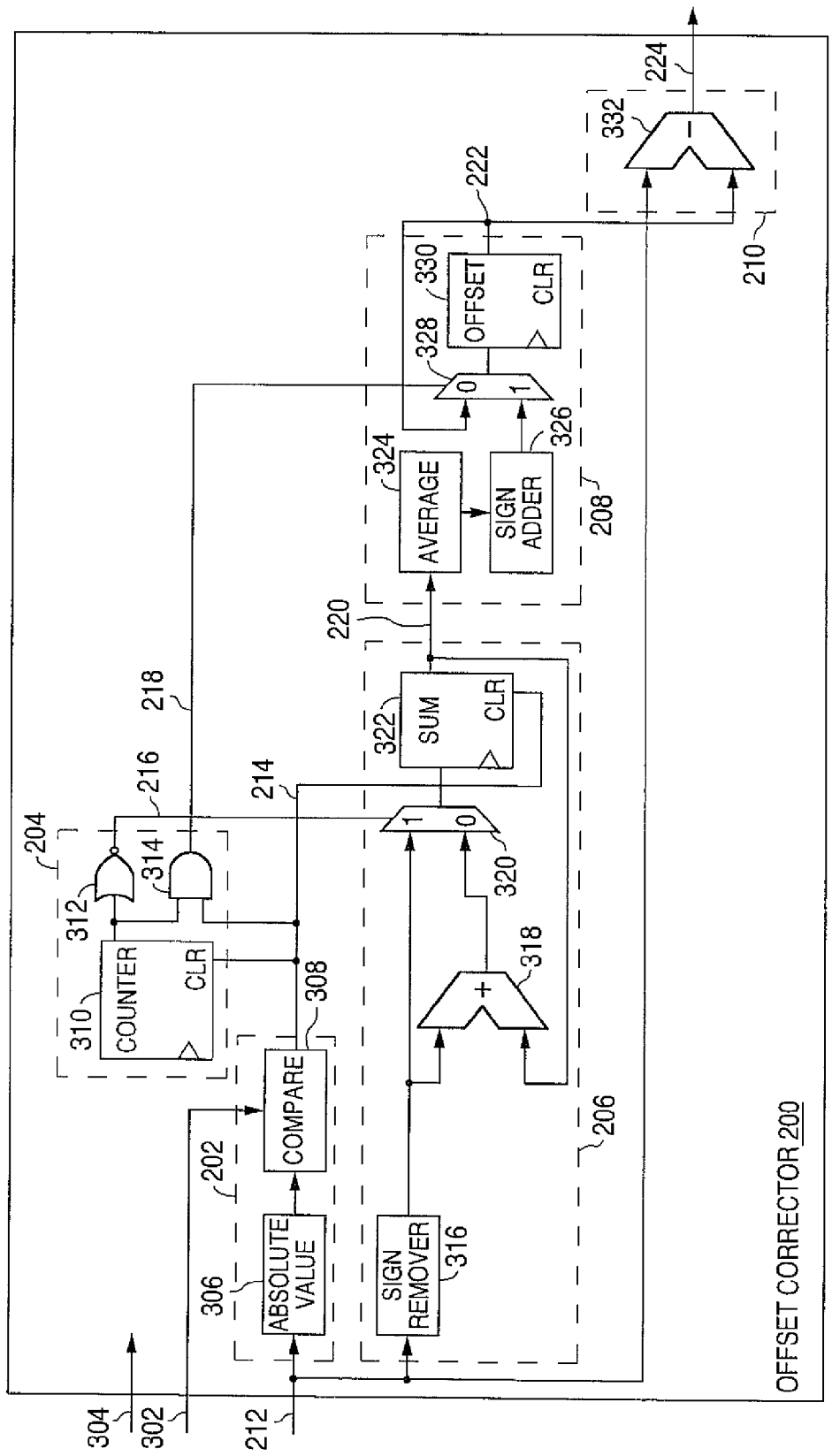
FIG. 3 illustrates the offset corrector of FIG. 2 in greater detail according to one embodiment of this disclosure.

FIG. 3 illustrates the offset corrector 200 in greater detail according to one embodiment of this disclosure. For this embodiment, the offset corrector 200 is operable to receive an acquisition threshold 302, which may be statically configured at system start-up, and an ADC clock signal 304. In addition, the uncorrected samples 212 comprise signed binary two's complement values received from an ADC, and the nominal voltage level is zero.

For the illustrated embodiment, the comparator 202 comprises absolute value logic 306 and compare logic 308. The absolute value logic 306 comprises combinational logic and is operable to determine the absolute value, or magnitude, of the uncorrected samples 212.

The compare logic 308 comprises combinational logic and is operable to compare the magnitude of each uncorrected sample 212 with the acquisition threshold 302. If the magnitude of an uncorrected sample 212 is greater than the acquisition threshold 302, indicating that the uncorrected sample 212 corresponds to a non-zero nominal voltage level, the compare logic 308 is operable to assert the met_threshold signal 214. However, if the magnitude of an uncorrected sample 212 is less than or equal to the acquisition threshold 302, indicating that the uncorrected sample 212 corresponds to a nominal voltage level of zero, the compare logic 308 is operable to de-assert the met_threshold signal 214. Thus, the comparator 202 is operable to ensure that the offset calculation is performed when the uncorrected samples 212 are below a value (i.e., the acquisition threshold 302) that is considered silence, indicating that the receiver in which the offset corrector 200 is implemented is idle.

The counter 204 comprises a binary counter 310 that is synchronous to the ADC clock signal 304, as well as a multi-input NOR gate 312 and an AND gate 314. The counter 204 is operable to control the summation of uncorrected samples 212 and calculation of the offset 222. The binary counter 310 comprises a fixed maximum value that may be determined based on the specific implementation. For simplicity, the binary counter 310 may have a maximum value that is a power of two. The binary counter 310 is operable to increment when the comparator 202 is de-asserting the met_threshold signal 214. However, when the comparator 202 is asserting the met_threshold signal 214, the binary counter 310 is operable to be reset to zero. When the binary counter 310 comprises a value of zero, the counter 204 is operable to assert the start_sum signal 216 by way of the NOR gate 312. When the binary counter 310 comprises its maximum value, the counter 204 is operable to assert the calculate signal 218 by way of the AND gate 314.

The summation block 206 comprises sign remover logic 316, an addition block 318, a multiplexer 320 and a summation register 322. The sign remover logic 316 comprises combinational logic and is operable to invert the sign bit of each uncorrected sample 212 in order to represent the uncorrected sample 212 in binary, unsigned notation. This inversion operation has the effect of adding a value equal to half of the full range of the ADC to the uncorrected sample 212, thereby shifting the sample value such that the minimum value is zero.

The addition block 318 is operable to add the unsigned, shifted sample from the sign remover logic 316 to any previous summation of samples and to output the sum to the multiplexer 320. The multiplexer 320 is also operable to receive the unsigned, shifted sample from the sign remover logic 316. When the start_sum signal 216 is asserted by the counter 204, the multiplexer 320 outputs the unsigned, shifted sample. However, when the start_sum signal 216 is de-asserted by the counter 204, the multiplexer 320 outputs the sum generated by the addition block 318.

The summation register 322, which is synchronous to the ADC clock signal 304, receives the output of the multiplexer 320 and is operable to store a running summation of the unsigned, shifted samples. When the comparator 202 is asserting the met_threshold signal 214, the summation register 322 is operable to be reset to zero. When the comparator 202 is de-asserting the met_threshold signal 214 and the counter 204 is asserting the start_sum signal 216, the summation register 322 is operable to store as a summation 220 a current unsigned, shifted sample. When the comparator 202 is de-asserting the met_threshold signal 214 and the counter 204 is de-asserting the start_sum signal 216, the summation register 322 is operable to store the summation 220 of the current unsigned, shifted sample and a previous sum.

The offset generator 208 comprises averaging logic 324, sign adder logic 326, a multiplexer 328 and an offset register 330. The averaging logic 324 comprises combinational logic and is operable to compute the average of the unsigned, shifted samples summed by the addition block 318 by dividing the summation 220 by the maximum number of samples to be summed, which corresponds to the maximum value of the binary counter 310. This average is the average, unsigned offset of the uncorrected samples 212.

The sign adder logic 326 comprises combinational logic and is operable to invert the sign bit of the average, unsigned offset in order to represent the average, unsigned offset in binary, signed notation. This inversion operation has the effect of subtracting a value equal to half of the full range of the ADC to the average, unsigned offset. The sign adder logic 326 is also operable to output the signed offset to the multiplexer 328, which is also operable to receive a previously generated offset 222. When the calculate signal 218 is de-asserted by the counter 204, the multiplexer 328 outputs the previously generated offset 222. However, when the calculate signal 218 is asserted by the counter 204, the multiplexer 328 outputs the signed offset generated by the sign adder logic 326, which corresponds to a newly generated offset 222.

The offset register 330, which is synchronous to the ADC clock signal 304, receives the output of the multiplexer 328 and is operable to store the output and generate the offset 222 based on the output. Thus, when the calculate signal 218 is de-asserted, the offset register 330 is operable to continue generating a same offset 222. However, when the calculate signal 218 is asserted, the offset register 330 is operable to generate a new offset 222. The offset applier 210 comprises a subtraction block 332. The subtraction block 332 comprises combinational logic that is operable to subtract the signed offset 222 from each signed uncorrected sample 212 to generate a corrected sample 224.

Figure 4:
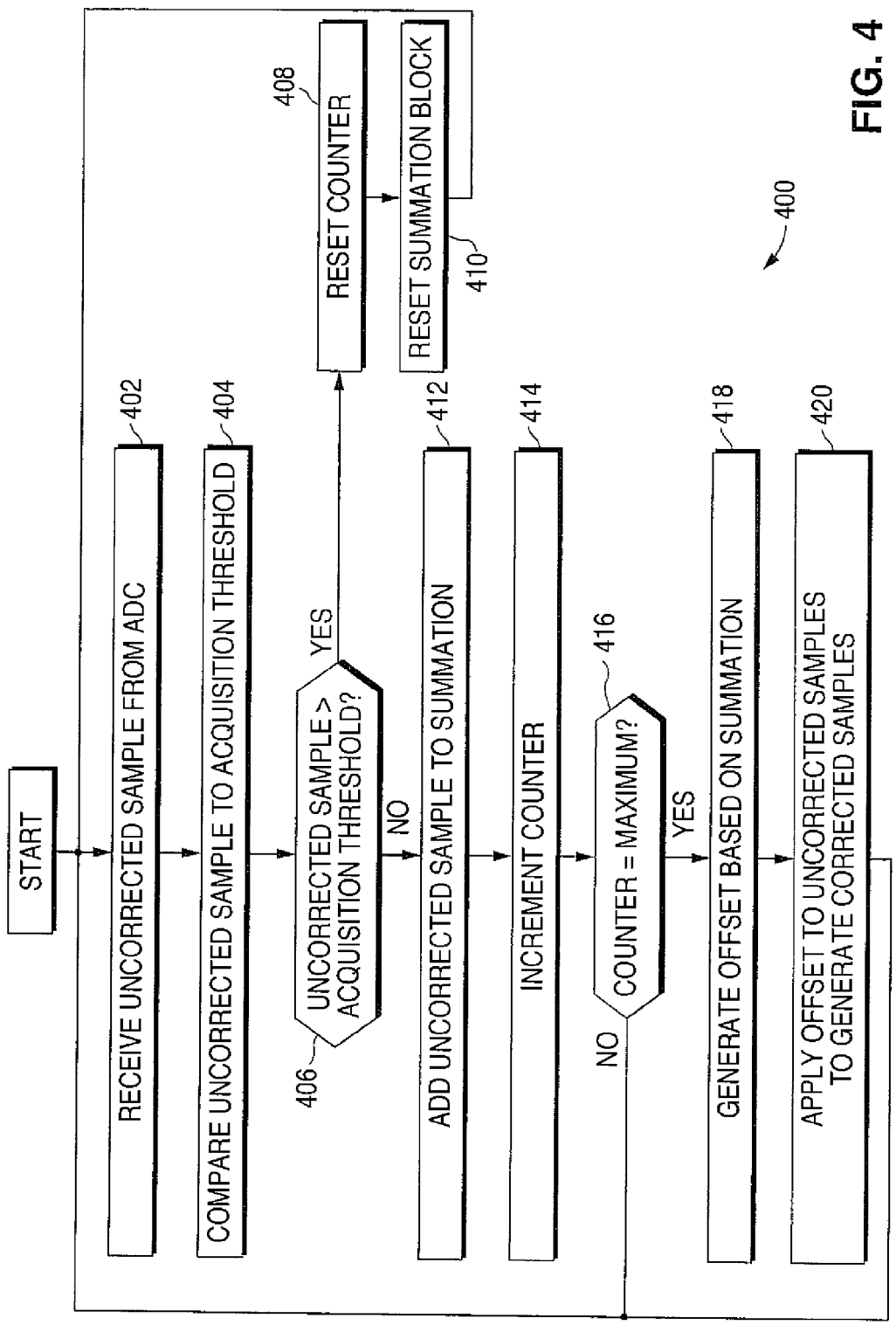
FIG. 4 illustrates a method for providing dynamic DC offset correction using the offset corrector of FIG. 2 according to one embodiment of this disclosure.

FIG. 4 illustrates a method 400 for providing dynamic DC offset correction using the offset corrector 200 according to one embodiment of this disclosure. Although described as discrete steps in a particular order, it will be understood that each component of the offset corrector 200 may perform its function based on one or more input signals when the one or more input signals are received.

Initially, an uncorrected sample 212 is received from an analog-to-digital converter (ADC) (step 402). The comparator 202 compares the uncorrected sample 212 to an acquisition threshold 302 (step 404). For a particular embodiment, the comparator 202 may determine the magnitude of the uncorrected sample 212 and compare the magnitude to the acquisition threshold 302.

If the uncorrected sample 212 is greater than the acquisition threshold 302 (step 406), the counter 204 is reset to zero (step 408) and the summation block 206 is reset to zero (step 410). At this point, another uncorrected sample 212 may be received (step 402), and the method continues as before.

However, if the uncorrected sample 212 is less than or equal to the acquisition threshold 302 (step 406), indicating that the uncorrected sample 212 corresponds to a predefined nominal voltage level, the summation block 206 adds the uncorrected sample 212 to a summation 220 (step 412) and the counter 204 is incremented (step 414). For a particular embodiment, the summation block 206 converts the uncorrected sample 212 from signed notation to unsigned notation before adding the unsigned sample 212 to the summation 220.

If the counter 204 has not reached its maximum value (step 416), another uncorrected sample 212 may be received (step 402), and the method continues as before. If the counter 204 has reached its maximum value (step 416), indicating that the uncorrected samples 212 have remained at the nominal voltage level for a sufficient length of time (i.e., a hold period), the offset generator 208 generates an updated offset 222 based on the summation 220 (step 418). For a particular embodiment, the offset generator 208 may generate the offset 222 by dividing the summation 220 by the maximum value of the counter 204, which corresponds to the number of uncorrected samples 212 included in the summation 220, and converting this average value from unsigned notation to signed notation. For embodiments in which the nominal voltage level is a non-zero value, the offset 222 may be generated by also subtracting the nominal voltage level from the average value.

The offset applier 210 then applies the offset 222 to subsequent uncorrected samples 212 to generate corrected samples 224 (step 420). For a particular embodiment, the offset applier 210 subtracts the offset 222 from the uncorrected samples 212 to generate the corrected samples 224. At this point, another uncorrected sample 212 may be received (step 402), and the method continues as before.

In this way, a hold period during which the receiver remains at a nominal voltage, such as the silent period of a 10 Mb/s Ethernet receiver 100, may be used to calculate an accurate offset 222 for correcting samples 212. In addition, this may be accomplished using only digital logic, instead of using a combination of analog and digital solutions. As a result, the offset corrector 200 is easily portable to many ASIC designs with minimal effort. Also, pre-silicon verification of a purely digital offset corrector 200 generally requires less effort as compared to a mixed analog and digital solution.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for providing dynamic DC offset correction, comprising:
   receiving a plurality of uncorrected samples;
   determining whether a specified number of consecutive uncorrected samples corresponding to a nominal voltage level has been received, wherein the determining comprises:
   comparing an actual voltage level of an uncorrected sample to an acquisition threshold; and resetting a counter and a summation block when the actual voltage level of the uncorrected sample is greater than the acquisition threshold; and when the specified number of consecutive uncorrected samples corresponding to the nominal voltage level has been received, generating an offset based on the actual voltage level for each of the consecutive uncorrected samples.

2. The method of claim 1, further comprising applying the offset to subsequent uncorrected samples to generate corrected samples.

3. The method of claim 2, applying the offset to the subsequent uncorrected samples comprising subtracting the offset from the subsequent uncorrected samples.

4. The method of claim 1, the nominal voltage level comprising zero.

5. The method of claim 1, wherein the acquisition threshold is operable to identify uncorrected samples that correspond to a nominal voltage level of zero.

6. The method of claim 1, generating the offset based on the actual voltage level for each of the consecutive uncorrected samples comprising:
 inverting a sign bit for each of the consecutive uncorrected samples to generate an unsigned sample;
 summing the unsigned samples to generate a summation;
 dividing the summation by the specified number to generate an unsigned offset; and
 inverting a sign bit for the unsigned offset to generate the offset.

7. A method for providing dynamic DC offset correction, comprising:
 receiving a plurality of uncorrected samples;
 determining whether a specified number of consecutive uncorrected samples corresponding to a nominal voltage level has been received; and
 when the specified number of consecutive uncorrected samples corresponding to the nominal voltage level has been received, generating an offset based on an actual voltage level for each of the consecutive uncorrected samples, wherein the generating comprises:
  inverting a sign bit for each of the consecutive uncorrected samples to generate an unsigned sample;
  summing the unsigned samples to generate a summation;
  dividing the summation by the specified number to generate an unsigned offset; and
  inverting a sign bit for the unsigned offset to generate the offset.

8. A method for providing dynamic DC offset correction, comprising:
 receiving a plurality of uncorrected samples;
 comparing an actual voltage level of each uncorrected sample to an acquisition threshold;
 when an uncorrected sample comprises an actual voltage level less than or equal to the acquisition threshold, adding the actual voltage level to a summation;
 when an uncorrected sample comprises an actual voltage level greater than the acquisition threshold, resetting the summation to zero; and
 when a specified number of consecutive uncorrected samples comprising an actual voltage level less than or equal to the acquisition threshold has been received, generating the offset based on the summation.

9. The method of claim 8, adding the actual voltage level to the summation comprising inverting a sign bit for the uncorrected sample to generate an unsigned sample and adding the unsigned sample to the summation.

10. The method of claim 9, generating the offset based on the summation comprising dividing the summation by the specified number to generate an unsigned offset and inverting a sign bit for the unsigned offset to generate the offset.

11. The method of claim 8, further comprising applying the offset to subsequent uncorrected samples to generate corrected samples.

12. The method of claim 11, applying the offset to the subsequent uncorrected samples comprising subtracting the offset from the subsequent uncorrected samples.

13. The method of claim 8, the acquisition threshold operable to identify uncorrected samples that correspond to a nominal voltage level of zero.

14. A system for providing dynamic DC offset correction, comprising:
 a comparator operable to:
  compare an actual voltage level for each of a plurality of uncorrected samples to an acquisition threshold;
  set a threshold signal to a first value when an uncorrected sample is greater than the acquisition threshold; and
  set the threshold signal to a second value when the uncorrected sample is less than or equal to the acquisition threshold;
 a counter coupled to the comparator, the counter comprising a counter value that is operable to:
  be reset to zero when the comparator sets the threshold signal to the first value; and
  be incremented when the comparator sets the threshold signal to the second value;
 a summation block coupled to the comparator and the counter, the summation block operable to generate a summation based on the actual voltage levels of the uncorrected samples and based on the counter value; and
 an offset generator coupled to the counter and the summation block, the offset generator operable to generate an offset based on the summation and the counter value.

15. The system of claim 14, the comparator comprising absolute value logic operable to determine an absolute value of each uncorrected sample.

16. The system of claim 15, wherein the uncorrected samples comprise signed binary two's complement values from an analog-to-digital converter.

17. The system of claim 14, the counter further comprising a NOR gate and an AND gate, the NOR gate operable to assert a start_sum signal when the counter value comprises zero and to de-assert the start_sum signal when the counter value comprises a non-zero value, and the AND gate operable to assert a calculate signal when the counter value comprises a maximum value and to de-assert the calculate signal when the counter value comprises a non-maximum value.

18. The system of claim 17, the summation block comprising:
 sign remover logic operable to invert a sign bit for each uncorrected sample to generate an unsigned sample;
 an addition block coupled to the sign remover logic, the addition block operable to add the unsigned sample to the summation to generate an addition block output;
 a first multiplexer coupled to the sign remover logic and the addition block, the first multiplexer operable to generate an output comprising the unsigned sample when the start_sum signal is asserted and comprising the addition block output when the start_sum signal is de-asserted; and
 a summation register coupled to the first multiplexer, the summation register operable to receive the output from the first multiplexer and to generate the summation based on the output from the first multiplexer.

19. The system of claim 18, the offset generator comprising:

averaging logic operable to generate an average voltage level of the uncorrected samples by dividing the summation by the maximum value of the counter;

sign adder logic coupled to the averaging logic, the sign adder logic operable to invert a sign bit for the average voltage level to generate a signed offset;

a second multiplexer coupled to the sign adder logic, the second multiplexer operable to generate an output comprising a previously generated offset when the calculate signal is de-asserted and comprising the signed offset when the calculate signal is asserted; and an offset register coupled to the second multiplexer, the offset register operable to receive the output from the second multiplexer and to generate the offset based on the output from the second multiplexer.

20. The system of claim 14, further comprising an offset applier coupled to the offset generator, the offset applier operable to subtract the offset from subsequent uncorrected samples to generate corrected samples.

\* \* \* \* \*